United States Patent
Roberts et al.

(10) Patent No.: US 7,286,060 B2
(45) Date of Patent: Oct. 23, 2007

(54) INDICATORS FOR VACUUM TUBE REPLACEMENT DEVICES

(75) Inventors: Douglas H. Roberts, Bellevue, WA (US); Brett A. Hertzberg, Bellevue, WA (US)

(73) Assignee: Roberts Retrovalve, Inc., Bellevue, WA (US)

( * ) Notice: Subject to any disclaimer, the term of this patent is extended or adjusted under 35 U.S.C. 154(b) by 279 days.

(21) Appl. No.: 11/203,077

(22) Filed: Aug. 12, 2005

(65) Prior Publication Data
US 2007/0035408 A1  Feb. 15, 2007

(51) Int. Cl.
G08B 5/00 (2006.01)
(52) U.S. Cl. .................. 340/815.4; 330/2; 340/653; 340/660; 340/664; 340/815.45
(58) Field of Classification Search ............ 340/815.4, 340/815.45, 815.65, 691.6, 635, 653, 660, 340/664; 381/118, 120; 327/599; 330/2
See application file for complete search history.

(56) References Cited

U.S. PATENT DOCUMENTS

| | | | |
|---|---|---|---|
| 4,143,323 A * | 3/1979 | Cieslak et al. ............. 340/653 |
| 4,864,245 A | 9/1989 | Kasha ......................... 330/65 |
| 5,208,548 A | 5/1993 | Van Riezen ................. 330/59 |
| 5,434,536 A | 7/1995 | Pritchard .................... 327/599 |
| 5,648,664 A | 7/1997 | Rough et al. ............... 257/135 |
| 5,705,950 A * | 1/1998 | Butler ......................... 330/3 |
| 2002/0109544 A1 * | 8/2002 | Butler ......................... 330/3 |
| 2006/0018085 A1 * | 1/2006 | Kelly .......................... 381/120 |
| 2006/0176046 A1 * | 8/2006 | Walker ........................ 324/142 |

* cited by examiner

*Primary Examiner*—Thomas Mullen
(74) *Attorney, Agent, or Firm*—Brett A. Hertzberg; Merchant & Gould PC

(57) ABSTRACT

A vacuum tube replacement device includes an indicator. The indicator can be arranged to provide audible and/or visual indication of system performance, function, status, or any other desired indication. The vacuum tube replacement device is pin-for-pin compatible with standard vacuum tube circuit pin configurations. The replacement device may be a solid-state tube emulator device, a traditional glass envelope vacuum tube device, or some other hybrid device. The visual indicator is equally useful for non-vacuum tube replacement devices such as audio amplifier circuits.

43 Claims, 11 Drawing Sheets

INDICATORS FOR VACUUM TUBE REPLACEMENT DEVICES

FIELD OF THE INVENTION

The present disclosure generally relates to devices that may be used to provide indicators for vacuum tubes, such as pin-for-pin compatible devices that replace traditional glass vacuum tube devices. Such devices may be employed in audio amplifiers including guitar/musical instrument amplifier, hi-fi amplifiers, and any device that may benefit from such indicators.

BACKGROUND

Glass vacuum tubes have been widely used in audio applications such as amplification of musical instruments as well as hi-fidelity reproduction. Although solid-state circuit technology has also been developed for use in such audio applications, vacuum tubes are still being used in audio applications. Many modern audio applications still use vacuum tubes for their acoustic properties, as well as their esthetic appeal.

The quality control effort associated with traditional vacuum tube devices is inevitably subject to less efficient production standards as compared to a solid-state solution. Traditional vacuum tube devices include a glass surround that is vacuum-sealed to a socket base similar to a light bulb. Inside the glass surround, a complex structure of metal plates, filaments, and other metal plated material arrangements are necessary to provide the proper function of the vacuum tube. Vacuum tube devices are prone to mechanical failure similar to light bulbs, where the filament materials eventually break due to mechanical failure. Solid-state devices are significantly less expensive to manufacture, smaller in size, and less prone to mechanical anomalies.

Solid-state technology has been acknowledged for cost, performance, manufacturing, and/or other advantages over glass vacuum tubes. A variety of conventional solid-state circuits have been developed to provide pin-for-pin compatible replaceable devices. The use of these solid-state devices has been applied to signal amplification functions and related compression and/or non-linear signal limiting properties.

The disclosure described herein expands on the application of vacuum tubes and other pin-for-pin compatible vacuum tube replacement devices by incorporating indicators to enhance the user awareness, functionality, aesthetic nature, and/or safety, as well as other application of these devices. As will be further described, the indicators may also be useful in other non-vacuum tube based applications.

BRIEF DESCRIPTION OF THE DRAWINGS

Non-limiting and non-exhaustive embodiments are described with reference to the following drawings.

DETAILED DESCRIPTION

Figure 1:
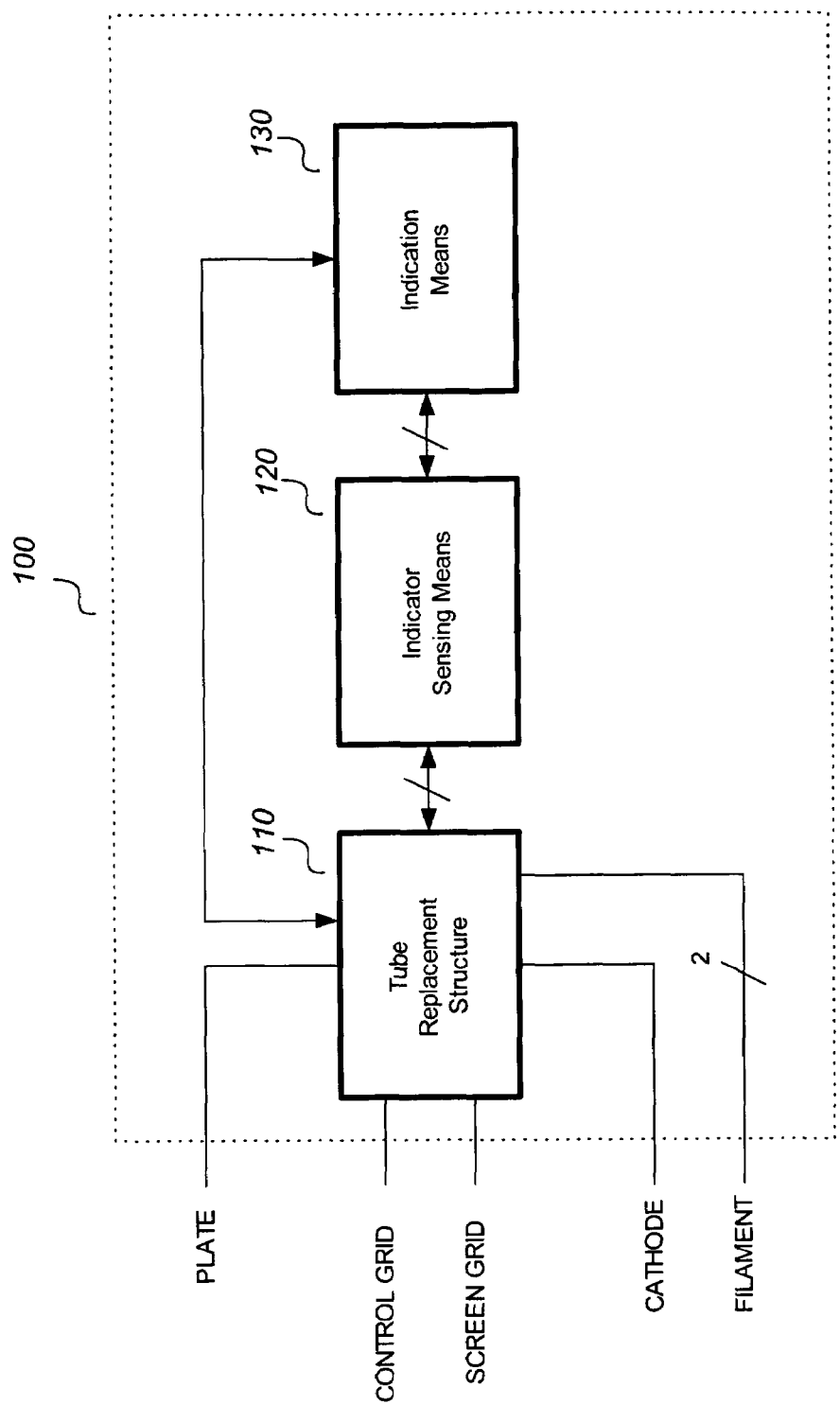
FIG. 1 illustrates an example system for a tube replacement device.

Various embodiments will be described in detail with reference to the drawings, where like reference numerals represent like parts and assemblies throughout the several views. Reference to various embodiments does not limit the scope of the present disclosure, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary there between. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity.

Briefly stated, the present disclosure generally relates to a vacuum tube replacement device that includes an indicator means. The indicator means can be arranged to provide audible and/or visual indication of system performance, function, status, or any other desired indication. The vacuum tube replacement device is pin-for-pin compatible with standard vacuum tube circuit configurations/filament topologies such as diodes, triodes, and/or pentodes, and pin base arrangements such as octal 7-pin, octal 8-pin, Noval B9A, or other styles to name a few. The replacement device may be a solid-state tube emulator device, a traditional glass envelope vacuum tube device, or some other hybrid device. The visual indicator means is equally useful for non-vacuum tube replacement devices such as audio amplifier circuits.

The indicator means for each vacuum tube replacement device can be comprised of any reasonable indication means. Some example indicator means comprise an output means that corresponds to at least one of: a visual indicator means, a light-emitting diode (LED) device, multiple LED devices arranged in a circuit, a multi-color LED device arranged in a circuit, multiple LED devices of different colors arranged in a circuit, at least two LED devices that are arranged to illuminate in a sequence pattern, an audio indicator means, a speaker, a buzzer, a piezo device, an audio output buffer, a peripheral interface that is arranged to provide a digital signal output, a peripheral interface that is arranged to provide an analog signal output, a serial communications interface that is arranged to provide serial communications, a parallel communications interface that is arranged to provide parallel communications, a fiber-optic communications interface that is arranged to provide fiber-optic transmission, a modulated communications interface that is arranged to provide modulated transmission, a graphics interface that is arranged to drive a graphics display, an alphanumeric interface that is arranged to drive an alphanumeric display, a CRT interface that is arranged to drive a CRT display, an LCD interface that is arranged to drive an LCD display, and a signal injection means that is arranged to inject an audio signal in an audio signal path of the tube replacement structure.

FIG. 1 is an illustration of an example system (100) for a tube replacement device that includes a means for sensing and communicating with at least one indicator. The indicators may be related to the tube replacement structures operational or functional behavior as will be further described below. Example system 100 includes a tube replacement structure (110), an indicator sensing means (120), and an indication means (130). The tube replacement structure (110) is in electrical communication with the indicator sensing means (120), which is in electrical communication with one or more indication means (130). The tube replacement structure (110) may also be in electrical communication with the indication means (130). The various functional and/or physical partitions illustrated by FIG. 1 are merely one example system, and the various partitions may be integrated into one or more physical and or functional partitions.

The tube replacement structure (110) may be arranged in a standard vacuum tube pin configuration such as, for example, one or more of: plate, grid, cathode, and filament connections. The vacuum tube pin configurations may be for preamplifier tubes, power amplifier tubes, and combined preamplifier/power amplifier tubes. Example diode and rectifier tubes include such styles as: 5AU4, 5Y3, 5BC3, 6CA4, etc. Example preamplifier tubes include styles such as: 12AX7, 12AT7, 12AU7, 6922, 7025, 5751, etc. Example power amplifier tubes include styles such as: EL34, EL84, 6L6, 6V6, 6550, 5881, KT66, KT88, etc.

Figure 10:
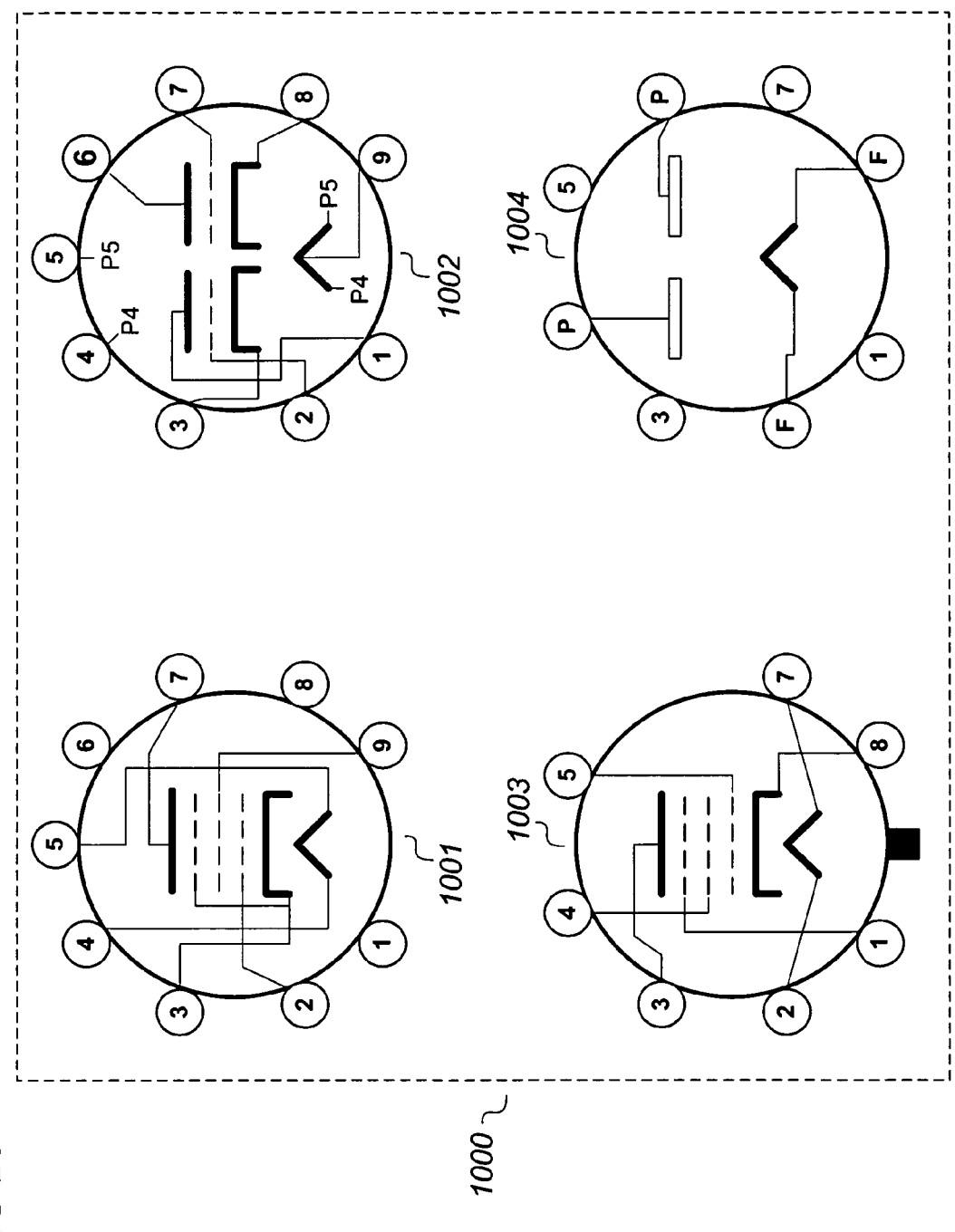
FIG. 10 illustrates example socket diagrams for example pin configurations.

Example standard pin arrangements are illustrated in FIG. 10. Example (1001) illustrates a 9 pin pentode such as an EL84/6BQ5. Example (1002) illustrates a 9 pin dual triode such as a 12AX7 or 6CA7. Example (1003) illustrates a keyed 7 pin pentode in an "octal arrangement" or 7-pin octal, such as an EL34, 6V6, or 6550. Example (1004) illustrates an 8 pin dual-rectifier arrangement such as a 5Y3GT.

Example rectifier devices include 5AU4/5AU4GT style rectifier tubes, 6CA4/EZ81 style rectifier tubes, 5AR4/GZ34 style rectifier tubes, 35W4 style rectifier tubes, 5BC3 style rectifier tubes, 5V4/5V4G/5V4GA style rectifier tubes, 5Y3 style rectifier tubes, 6BW4/6V4/EZ80 style rectifier tubes, 6X4/6X4W/6X4WA/EZ90 style rectifier tubes, 6X5GT/CV574/EZ35 style rectifier tubes, to name a few. Example data sheets associated with rectifier tubes, including their pin arrangements, are illustrated in Appendix A.

Example preamplifier devices include 12AX7/ECC83/7025/5751 style pre-amplifier tubes, 12AU7/12BH7/ECC99/6189/ECC82 style preamplifier tubes, 12AT7/6201/ECC81 style pre-amplifier tubes, 6DJ8/ECC88/6922/E88CC style pre-amplifier tubes, 12AY7 preamplifier tubes, and 6N1P/6H30/6C45PI/ECC99 style preamplifier tubes, to name a few. Example data sheets associated with preamplifier tubes, including their pin arrangements, are illustrated in Appendix B.

Example power-amplifier devices include 6BQ5/EL84/7189/SV83/6P14P/ 6P15P style power-amplifier tubes, 6550/KT88/KT90 style power-amplifier tubes, 6CA7/EL34 style power-amplifier tubes, 6L6/5881/KT66/7027 style power-amplifier tubes, and 6V6GTA/7408 style power-amplifier tubes. Example data sheets associated with power-amplifier tubes, including their pin arrangements, are illustrated in Appendix C.

Example combined pre-amplifier/power-amplifier devices include 8AU8 style pre-amplifier/power-amplifier tubes, 5BE8/6BE8 style pre-amplifier/power-amplifier tubes, and 6AZ8 style pre-amplifier/power-amplifier tubes. Example data sheets associated with combined pre-amplifier/power-amplifier tubes, including their pin arrangements, are illustrated in Appendix D.

In one example embodiment, the vacuum tube replacement device may be arranged to visually indicate a predetermined characteristic of the device that is set by the manufacturer. In another example embodiment, the vacuum tube replacement device may be arranged to visually indicate a predetermined characteristic of the device that is set by the user. In yet another example embodiment, the vacuum tube replacement device may be arranged to visually indicate an operating mode associated with the device. In still another example, the vacuum tube replacement device may be arranged to provide multiple visual indicators. Other example indicators will be further discussed below.

Figure 9:
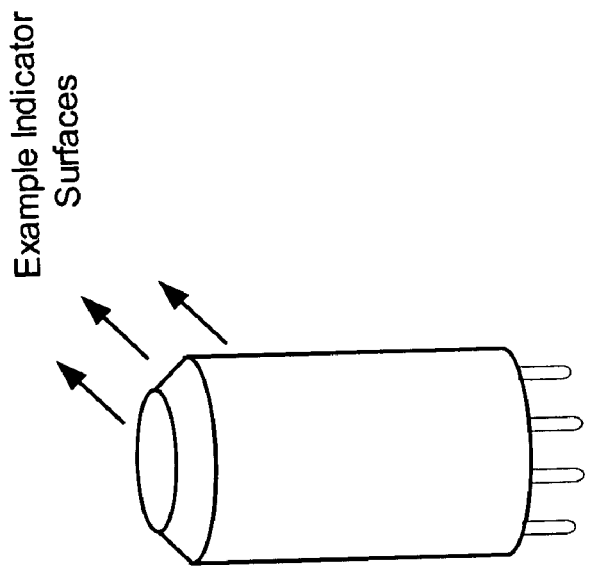
FIG. 9 illustrates an example tube replacement device that includes an example visual indicator system.

An example tube replacement structure is illustrated in FIG. 9, which includes at least one visual indicator that is arranged to illuminate in accordance with an aspect of the present disclosure. The tube replacement structure may include a number of regions that are defined between the base of the device where the pins are located, and a top of the device. As illustrated in the figure, the visual indicator(s) may be located in a variety of physical locations along the structure as may be desired. In one example, a visual indicator may be located about the top portion of the device. In another example, another visual indicator may be located about the curved or chamfered portion near the top portion of the device. In still another example, still another visual indicator may be located about the longitudinal portion of the body of the device, between the top portion and the base of the device. In yet another example, yet another visual indicator may be located about the base portion of the device.

Figure 2A:
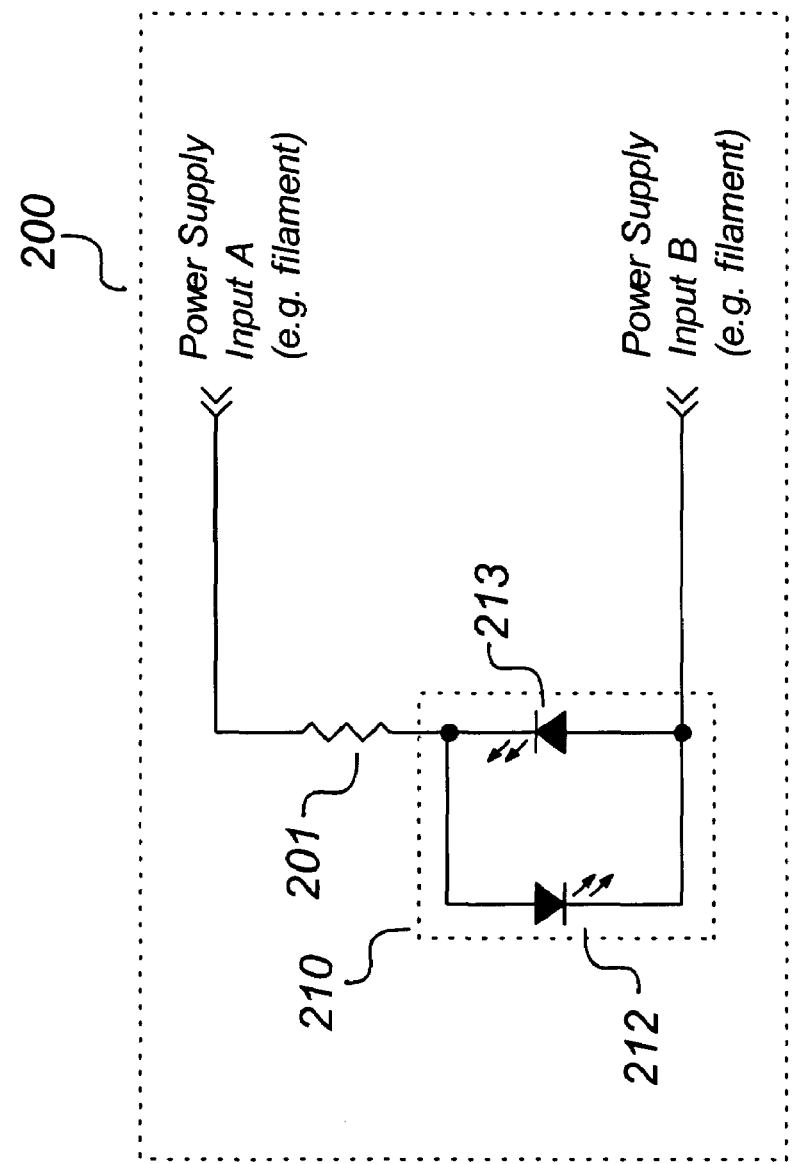
FIGS. 2A and 2B illustrate example circuits in which one or more light emitting diodes (LEDs) are arranged to provide visual indication associated with the operation of a tube replacement device.
Figure 2B:
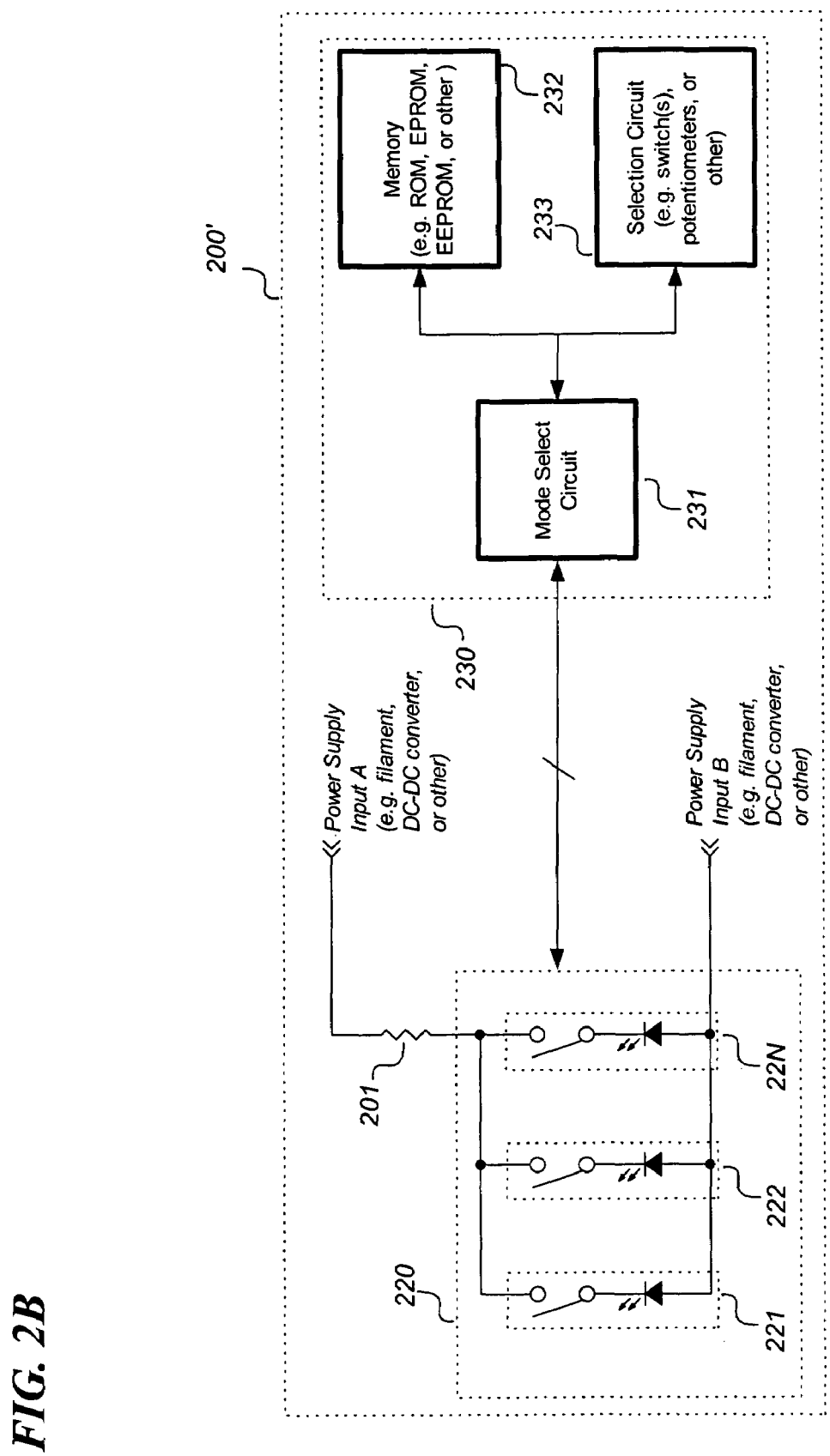

FIGS. 2A and 2B illustrate example circuits (200, 200') in which one or more light emitting diodes (LEDs) are arranged to provide visual indication associated with the operation of a tube replacement device (e.g., see FIG. 1). Circuit 200 includes a resistor circuit (201) that is series coupled between a first power supply input terminal (A) and a second power supply input terminal (B) via a visual indicator circuit (210). The example visual indicator circuit (210) includes one or more LED circuits (212, 213). Circuit 200' includes a resistor circuit (201) that is series coupled between a first power supply input terminal (A) and a second power supply input terminal (B) via another visual indicator circuit (220), which includes one or more (N) selectable LED circuits (221, 222 . . . 22N), and additional program control circuitry (230) that is coupled to the visual indicator circuit (220).

Emitted light from the visual indicators illustrated in FIGS. 2A and 2B may be color-coded to represent a particular tube replacement type, a specific function, or some other characteristic of the device such as a specific transfer function or "sound". Different colors may represent alternate characteristics of similar features. Example indicator features include "gain boost", "high gain", "medium gain", "low gain", "clipping", "clean", "filtering on/off", as well as others. Such visual indicators offer an aesthetic benefit combined with a functional indication of the tube replacement structures rated performance and/or operation.

The emission of light from the device indicates the presence of power to the tube structure, which may be used as a method of indicating amplifier power supply status. Because many tube amplifiers employ more than one power supply voltage, traditionally high voltage B+ and a low voltage/high current filament supply, this embodiment allows the user an additional method of determining the state of the amplifiers power status other than that traditionally derived from the amplifiers front panel.

The power supply for the visual indicators illustrated in FIGS. 2A and 2B may be the filament supply that is commonly used to initiate electron flow in traditional glass vacuum tube devices. However, any other appropriate supply may be used including both regulated and unregulated supplies, whether AC or DC derived. Example DC regulated supplies include both switching-type regulators and non-switching type regulators such as, for example, DC-DC converters, AC-DC inverters, series regulators, shunt regulators, LDO regulators, current-feedback regulators, voltage feedback regulators, to name a few. The output of the example regulators may be provided either directly to the circuits, or through an intermediary circuit such as, for example, a line filter circuit, surge protector circuit, an over-voltage protection circuit, a current-limiter circuit, an EMI filter, as well as any other appropriate circuit that may be desired.

Visual indicator circuit (210) includes LED circuits (212) and (213), arranged in parallel with one another with opposite polarities. The use of back-to-back LED circuits provides a configuration that can accommodate both AC and DC filament supply applications. Additional circuit components (not shown) may be provided such as a capacitor in parallel with the visual indicator circuit to provide filtering as well as other charge storage benefits. Although LED circuits (212) and (213) are illustrated as simple LED devices, other similar devices and circuits may be used to provide similar functionality as visual indicators.

Visual indicator circuit (220) includes one or more LED circuits (221-22N) that are arranged in parallel with one another. Each LED circuit includes a light-emitting device that is coupled in series with a switching circuit for selective enabling and disabling. Other circuits may be employed where the LED circuits each include an enable line such that the need for the switching circuits is eliminated. Other circuit arrangements are contemplated such as series coupled LED circuits, where switching circuits can selectively bypass the LED devices.

The example program control circuitry (230) includes a mode selector circuit (231), a memory circuit (232), and a selection circuit (233). The mode selector circuit (231) is arranged to cooperate with the memory circuit (232) and the selection circuit (233). The mode selector circuit can be a logic circuit, a processor circuit such as a microcontroller or microprocessor, or some other circuit as may be desired for decoding, adjusting, or maintaining the selection of the visual indicators. The memory circuit may be a random access memory (RAM), a read only memory (ROM), an erasable/programmable memory such as a EPROM or EEPROM, a look-up table, or some other memory means as may be desired. The selection circuit can be a dip-switch style selector, a push button style selector, a toggle switch selector, or some other user interface selection means.

The memory circuit (232), selection circuit (233), and the mode selector circuit (231) may not be required in all implementations since in a simplest visual indicator implementation, power is coupled directly to the visual indicator without the need for specific control circuits. However, in more complex scenarios where multiple indicators can be used to indicate different operating modes, operating states, or other status conditions, the control circuits may be more complex. Programmable style memories may be used to store operating conditions such that operating mode selection or other parameters may be stored for retrieval at some other point in time. In some situations, the mode selection is done during production and the settings are provided in a ROM, or perhaps a DIP switch that is not user accessible. Other examples are also understood within the context of the present disclosure.

Figure 3:
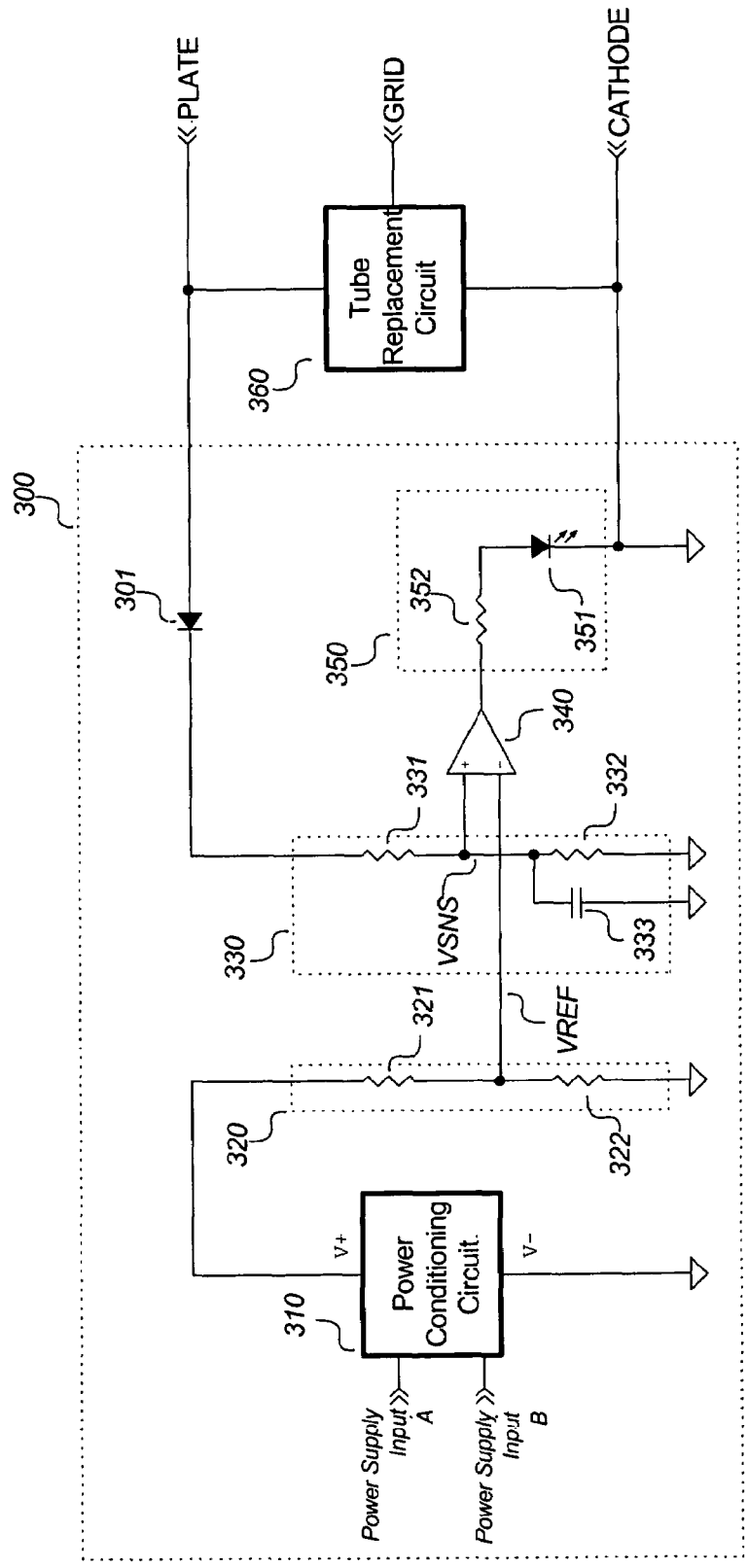
FIG. 3 illustrates an example visual indicator system for a tube replacement device.

FIG. 3 illustrates an example visual indicator system (300) for a tube replacement device. Visual indicator system (300) includes a power conditioning circuit (310), a reference generator circuit (320), a sense circuit (330), a comparator circuit (340), a visual indicator circuit (350), and a diode circuit (301). The power conditioning circuit (310) is coupled to the reference generator circuit (320), which provides a reference voltage (e.g., VREF) to the comparator circuit (340). The diode circuit (301) is series coupled between a power terminal (e.g., plate) and a ground terminal (e.g., cathode) of the tube replacement circuit (360) through the sense circuit (330) such that the sense circuit generates a voltage (e.g., VSNS) associated with the power terminal. The comparator circuit (340) is arranged to compare the sense voltage (VSNS) to the reference voltage (e.g., VREF) to selectively activate the visual indicator circuit (350).

The power conditioning circuit (310) can be a regulator circuit, a transformer circuit, a rectifier circuit, a filter circuit, an over-voltage protection circuit, a current-limiter circuit, a voltage limiter/clamp circuit, a buffer circuit, an isolation circuit, a voltage scaling circuit, or any other appropriate circuit or combination of circuits that provides an appropriate power/signal-conditioning characteristic, whether AC or DC derived. In some instances, the power conditioning circuit may include a transformer based circuit topology or a non-transformer based circuit topology. Example regulated supplies include both switching-type regulators and non-switching type regulators such as, for example, DC-DC converters, AC-DC inverters, series regulators, shunt regulators, LDO regulators, current-feedback regulators, voltage feedback regulators, to name a few. Example filter circuits include passive and active circuits such as high pass filters, low pass filters, band pass filters, notch filters, inverse notch filters, filter capacitors, storage capacitors, as well as any other appropriate filtering type circuit that may be desired.

The comparator circuit (340) may be powered by the power conditioning circuit (310) or via some other power supply. The reference generator circuit (320) is illustrated as a resistor divider network comprising resistor circuits 321 and 322, but other circuits are contemplated. An example reference generator circuit can be a programmable source such as a digital-to-analog converter (DAC). In another example programmable source, a resistor divider network that includes selectable tap points (e.g., a multiplexing switch that is coupled to each tap-point) that are selectively switched to a reference node that can be either buffered or un-buffered to provide the reference. Another example reference generator circuit can be one or more diodes that are used to generate a reference voltage directly from the filament supply lines. Still another example reference generator circuit includes a combination of resistors, capacitors, and/or diodes arranged to generate a reference voltage. Yet another example reference generator circuit includes a bandgap style voltage reference that is temperature compensated. The sense circuit (330) is illustrated as a resistor divider network comprising resistor circuits 331 and 332, where an optional capacitor circuit (333) is coupled in parallel with resistor circuit 332. The visual indicator circuit 350 is illustrated as an LED (351) that is arranged in series with a resistor circuit (352), but may be any other visual or audible indicator as previously discussed.

In one embodiment, the vacuum tube replacement device may visually indicate the amplifiers B+ power supply status as shown in FIG. 3. This example circuit employs a comparator detection circuit (330, 340) that produces a detection indication via LED 351, when the rectified and integrated or filtered signal present at the non-inverting input of the comparator (e.g., VSNS) exceeds a predefined user or manufacturer set threshold (e.g., VREF), determined by the voltage reference circuit (320). A trimmable potentiometer (trimpot) and or a series of resistors with corresponding dip switches may be employed in place of resistor circuits 321 or 322 to achieve a user-defined threshold (VREF). The integration time constant and plate voltage-sensing ratio is determined by the voltage divider/filter circuit 330. In this implementation, the integration time constant can be set to several seconds to filter out normal plate voltage variation or amplification signals in the audio range and the ratio of effective resistances of resistor circuits 331 and 332 are set to indicate the presence of the plate voltage (e.g., B+ voltage) within an expected operating range (e.g., 270V-400V).

In another embodiment, the integration time constant for circuit 330 can be made short in order to operate as a real-time plate voltage clipping detection circuit. The integration time constant and plate voltage ratio presented to the comparator circuit (340) can be changed to indicate plate voltage signal limiting within an expected operating signal magnitude and/or frequency range. This offers benefits, such as providing an indication to the user when a particular stage of the amplifier is operating in saturation. For example, the user may identify that: the audio signal is clipping in the preamp stage(s), saturation is occurring in the preamp stage(s), the audio signal is clipping in the power amplifier stage, saturation is occurring in the power amp stage of the amplifier, or a power supply sag is detected. An example advantage of the sensing topology illustrated in FIG. 3 is the reduced impact on the plate voltage dynamic range when high impedances are employed in the plate circuit.

Figure 4:
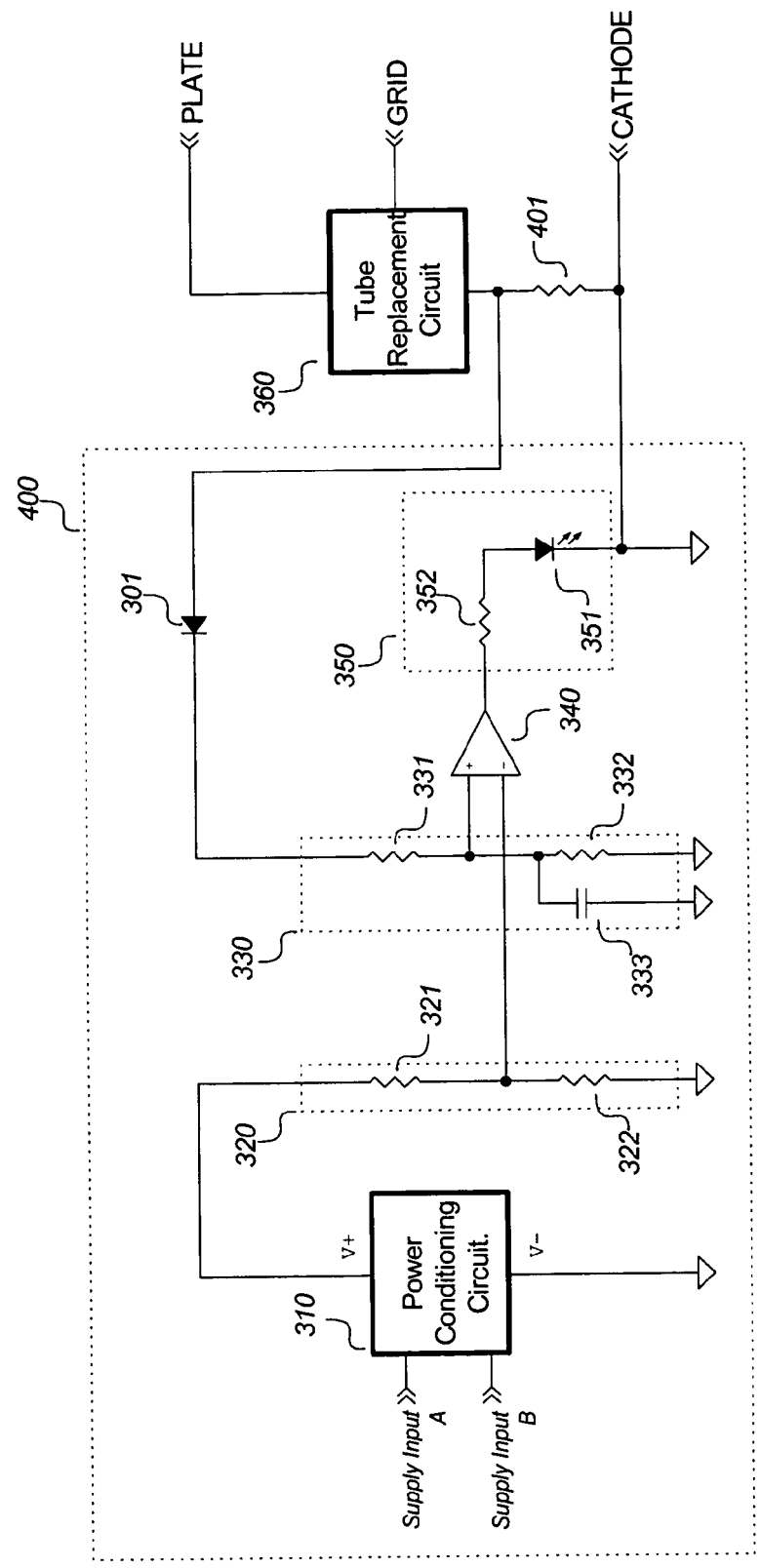
FIG. 4 illustrates another example visual indicator system for a tube replacement device.

FIG. 4 illustrates another example visual indicator system (400) for a tube replacement device. Visual indicator system 400 is similar to visual indicator system 300 with the exception that the sensing of the supply voltage(s) is derived from the tube replacement circuit's cathode current as shown in the figure. A sense resistor circuit (401) is arranged to evaluate the magnitude of the current flowing through the tube replacement circuit (360). The topology illustrated by FIG. 4 could be used to indicate a quiescent bias current indication such as class A, Class B, class AB1, class AB2, or to indicate some other biasing condition by setting the integration time constant long enough to sufficiently filter out the lowest expected signal bands. The quiescent bias current may be sensed during a "no input signal" or idle condition. The topology may also be used to evaluate a peak operating current condition, as well as other current conditions including DC measurements, AC measurements, RMS measurements, supply sag, to name a few.

An example alternate implementation may use a "flash" type analog-to-digital converter (ADC) arrangement such as stacked comparators with multiple voltage divider taps in place of the sense circuit (330), where the comparator circuit (340) may be arranged to indicate multi-level current or bias thresholds. The described implementation may further be arranged to change visual indication colors based on the bias setting for the tube replacement circuit (360).

In still another example embodiment, the input to the voltage divider/filter circuit in the sense circuit (330) is derived from a temperature sensing circuit that includes a thermocouple or some other temperature dependent device. This example embodiment could be arranged to provide indications for an over-temperature or an under-temperature condition. One benefit of this example embodiment could be to indicate a safety or electrical stress hazard such as: presence of an over-power condition, an accelerated wear-out operating condition, a reduction in overall performance, or a potential fire hazard.

Figure 5:
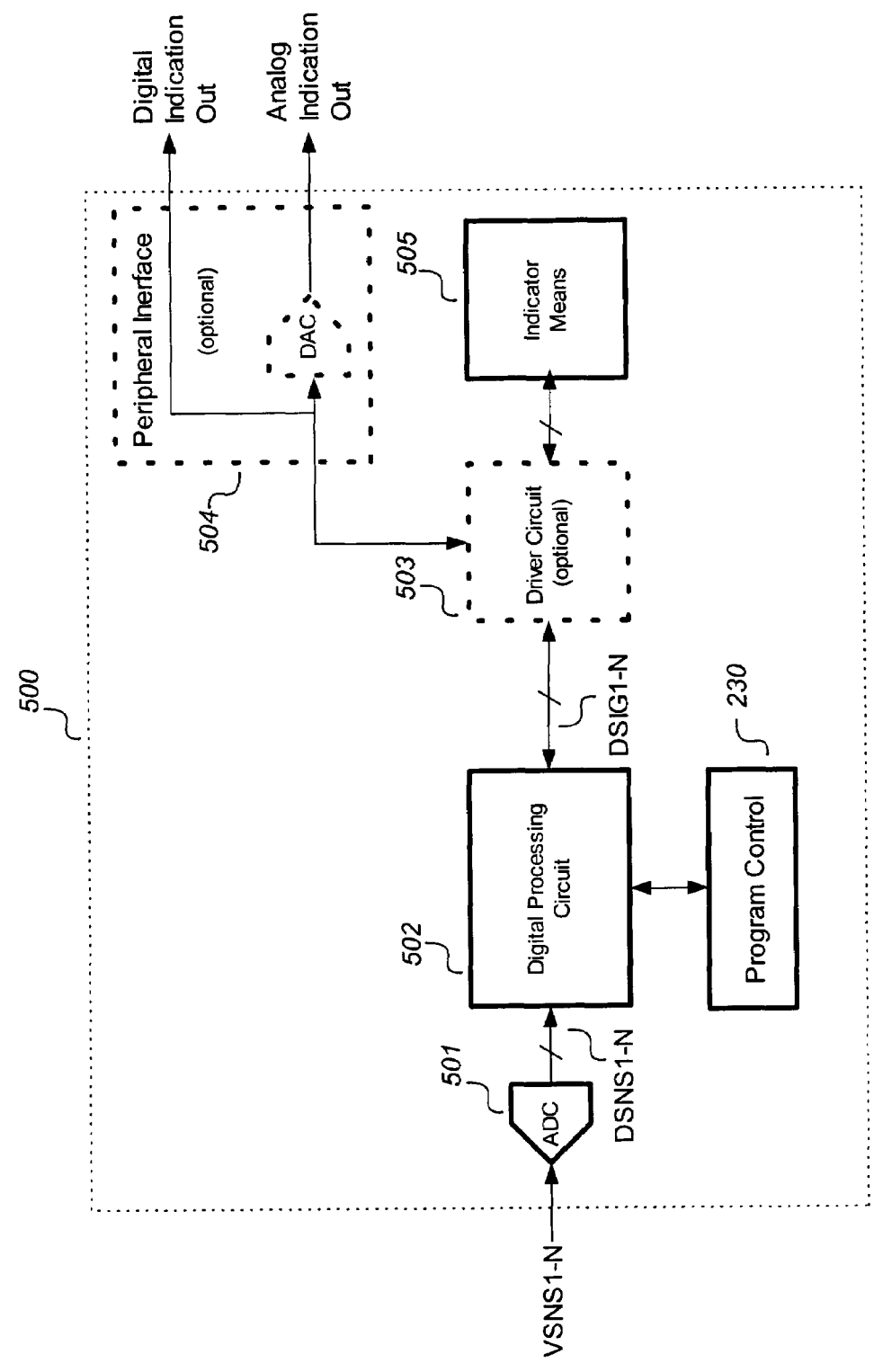
FIG. 5 illustrates an example indicator system that employs digital processing means.

FIG. 5 illustrates another example indicator system (500) that employs digital processing means. Indicator system 500 includes an analog-to-digital converter circuit (ADC 501), a digital processing circuit (502) with program control (230), an optional driver circuit (503), an optional peripheral interface circuit (504), and an indicator means (505). ADC circuit 501 is arranged to provide one or more digital signals (e.g., DSNS1 . . . DSNSN) in response to one or more sensed input signals (e.g., VSNS1 . . . VSNSN). Digital processing circuit 502 is arranged to provide one or more processed digital signals (DSIG1 . . . DSIGN) in response to digital signals (e.g., DSNS1 . . . DSNSN) based on the current program setting determined by the program control (230). The indication means (505) is arranged to provide an indication (e.g., visually, audibly, etc.) based on the processed digital signals. The driver circuit (503) may be necessary to provide proper signal levels and signal types to adequately drive the indicator means and/or the peripheral interface. The peripheral interface (504) may include circuits such as signal conditioners, filters, a digital-to-analog converter circuit (DAC), an isolation buffer circuit, a data-buffer circuit, a data-formatter circuit, a data serializer circuit, a USB communication circuit, or some other circuit that is arranged to communicate with external devices such as computers, audio amplifiers, video interfaces, data logging devices, etc.

For the example implementation illustrated by FIG. 5, an analog-to-digital converter (ADC 501) is used in place of the analog comparator system that was previously described with respect to FIGS. 3 and 4. Sense data from some sort of sensing circuit (e.g., thermal sensor, voltage sensor, current sensor, etc.) is coupled to the digital processing circuit (502) after conversion from an analog quantity to a digital quantity via ADC (501). The digital processing circuit may be a general-purpose processor (e.g., a micro-controller, micro-processor, DSP-processor, etc.) or a specially designed processor (e.g., custom ASIC, PLD, etc.) that analyzes sensory data for various criteria. A program may be selected by a user or predetermined by the manufacturer, which determines the type of indication to be conveyed.

Figure 6:
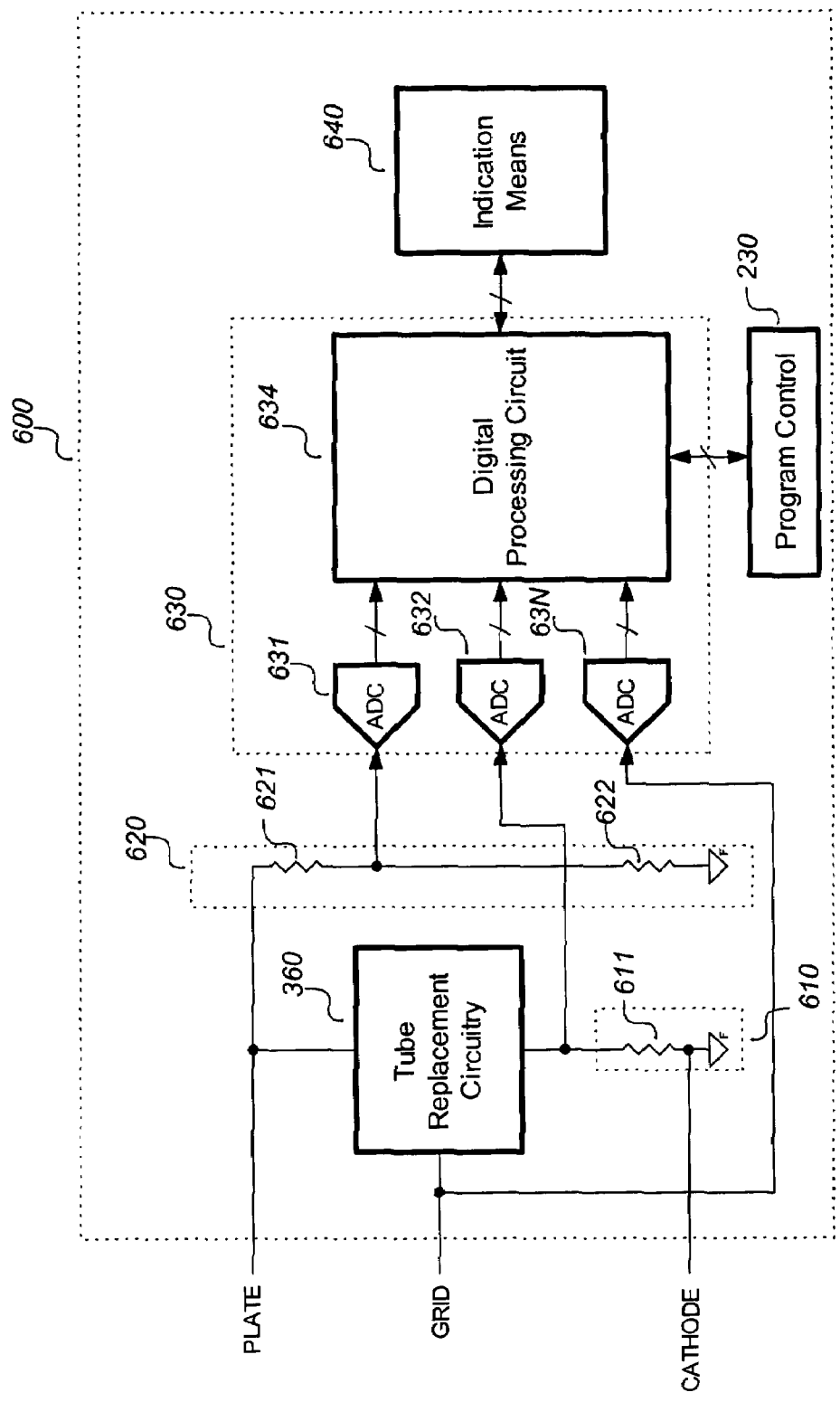
FIG. 6 illustrates an example indicator system with enhanced data-collection means.

FIG. 6 illustrates an example indicator system (600) with enhanced data-collection means. Indicator system 600 includes a first sensor means (610), a second sensor means (620), a sensor processing means (630) and an indicator means (640). The first sensor means (e.g., resistor circuit 611) is arranged to sense a current associated with a cathode terminal for the tube replacement circuit (360). The second sensor means (e.g., resistor circuits 621 and 622) are arranged to sense a voltage associated with the plate terminal of the tube replacement circuit (360). The digital processing circuit (634) is arranged in this example to communicate with program control (230), collect various synchronous or asynchronous data from the sensor means, and provide coupling to one or more indicator means (640, e.g., a speaker, an LED, etc).

One example sensor processing means (630) comprises a set of ADC circuits (631, 632 . . . 63N) and a digital processing circuit (634) similarly arranged to those described with respect to FIG. 5. Each ADC circuit converts a separate sensor signal to a digital quantity that is used by the digital processing circuit (634). In another example, the sensor processing means (630) is coupled to a single ADC circuit that is arranged to employ a multiplexer circuit to evaluate multiple sensor inputs. A plurality of these electrical sensing points are digitized in order to further enhance the indication datum such as real-time VI product or power indication, as well as other possible multiple input derived indications.

As an example embodiment, the indicator system architecture (600) may be arranged to acquire all necessary input and output metrics that are necessary to determine at least one of: power, current, voltage, heat dissipation, operating time, frequency, spectral content, as well as others. The acquired input and output metrics may be compared against known or identified reference(s), external or internal to the tube replacement structure, to indicate fault conditions, non-fault conditions, transitional, or other user/manufacturer identified semaphores. Examples include signal stage distortion such as non-linear or undefined behavior, over/under heat, power, voltage, current magnitude semaphores, statistical grouping of signal energy (band-spectrum), specific line interference or rejection semaphores, and/or any other user or OEM defined data type and/or magnitude that may be quantified and communicated by the system.

Figure 7:
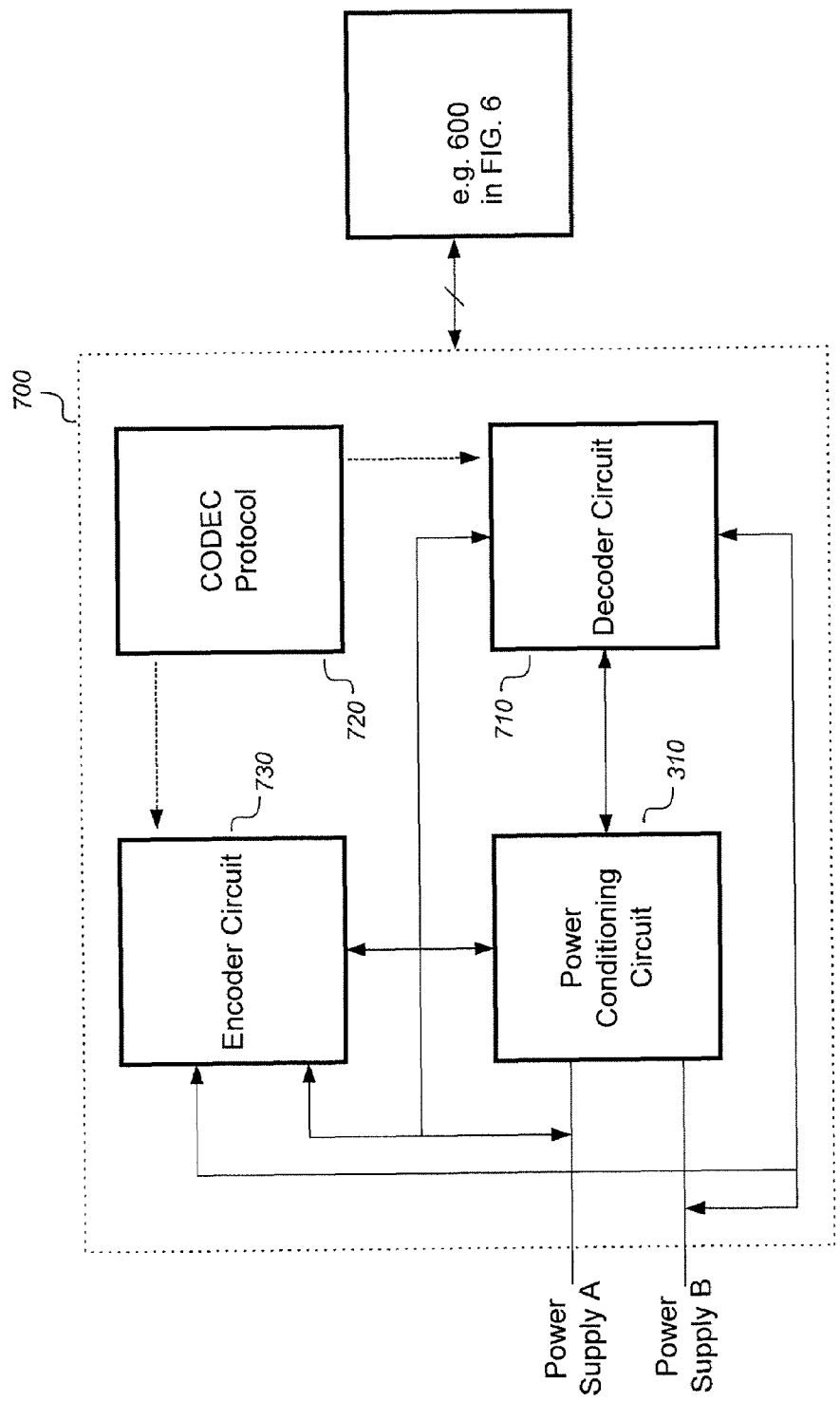
FIG. 7 illustrates an example indicator system that is arranged to interact with encoded control signals.

FIG. 7 illustrates an extended example indicator system (700) that is arranged to allow communication with a tube replacement circuit(s) that is arranged in an example indicator system (e.g. FIG. 6). As illustrated, the communication protocols may be encoded and decoded for transmission over at least one of the power supply means such as the filament power supply (AC or DC), or a plate or cathode supply for the tube replacement circuit. Standard and/or user defined coded signals may be transmitted over such described power supply means.

Example indicator system 700 includes a power-supply conditioning circuit (310), a decoder circuit (710), a codec protocol circuit (720), and an encoder circuit (730). The encoder and decoder circuits are arranged to communicate over one or more in-situ user power-supply terminals of the tube replacement device (or devices) and provides decoded signals to the tube replacement circuit (or circuits) and associated indicator means (e.g., see 600 in FIG. 6). The CODEC signal(s) can be implemented by an analog and/or digital scheme. In one example embodiment, a means of sending and receiving control signals through the target amplifiers filament supply is decoded in the tube replacement structure. The decoded commands may be latched in a non-volatile memory means (e.g., a battery backed-up RAM, an EEPROM, an NVRAM, etc.) and indicated as appropriate. An example advantage of this approach is that architectures utilizing programmable type tube replacement structures incorporating latching or non-latching features may also include a plurality of indicators for the programmed modes.

An existing amplifier system can be adapted for programmable operation by coupling data encoder circuit (730) to the filament wires of the existing circuit. Since filament wires are typically wired in common to every tube in the circuit, the modification to the existing circuit is simple and relatively non-invasive. Note that none of the existing sockets for the various vacuum tubes need to be modified in any way. Moreover, none of the circuits that are directly in the audio signal amplification path are modified to permit the programmability features described above. In other words, the signal integrity of the analog amplification path in the high-fidelity system or instrument amplifier system is not compromised by the addition of the data encoder system described herein.

Some non-limiting examples of visual indicators that are related to the embodiments described with respect to FIG. 7 are found as follows below. In one example, when the indicator mode is associated with an identified gain setting, a color associated with the gain setting can be illuminated (e.g., green ="low gain", blue="medium gain", red="high gain ", etc). In another example, when the indicator mode is associated with an identified overdrive setting, a color associated with the overdrive setting can be illuminated (e.g., green="clean", yellow="low overdrive", blue="medium overdrive", red="high overdrive", etc).

Figure 8:
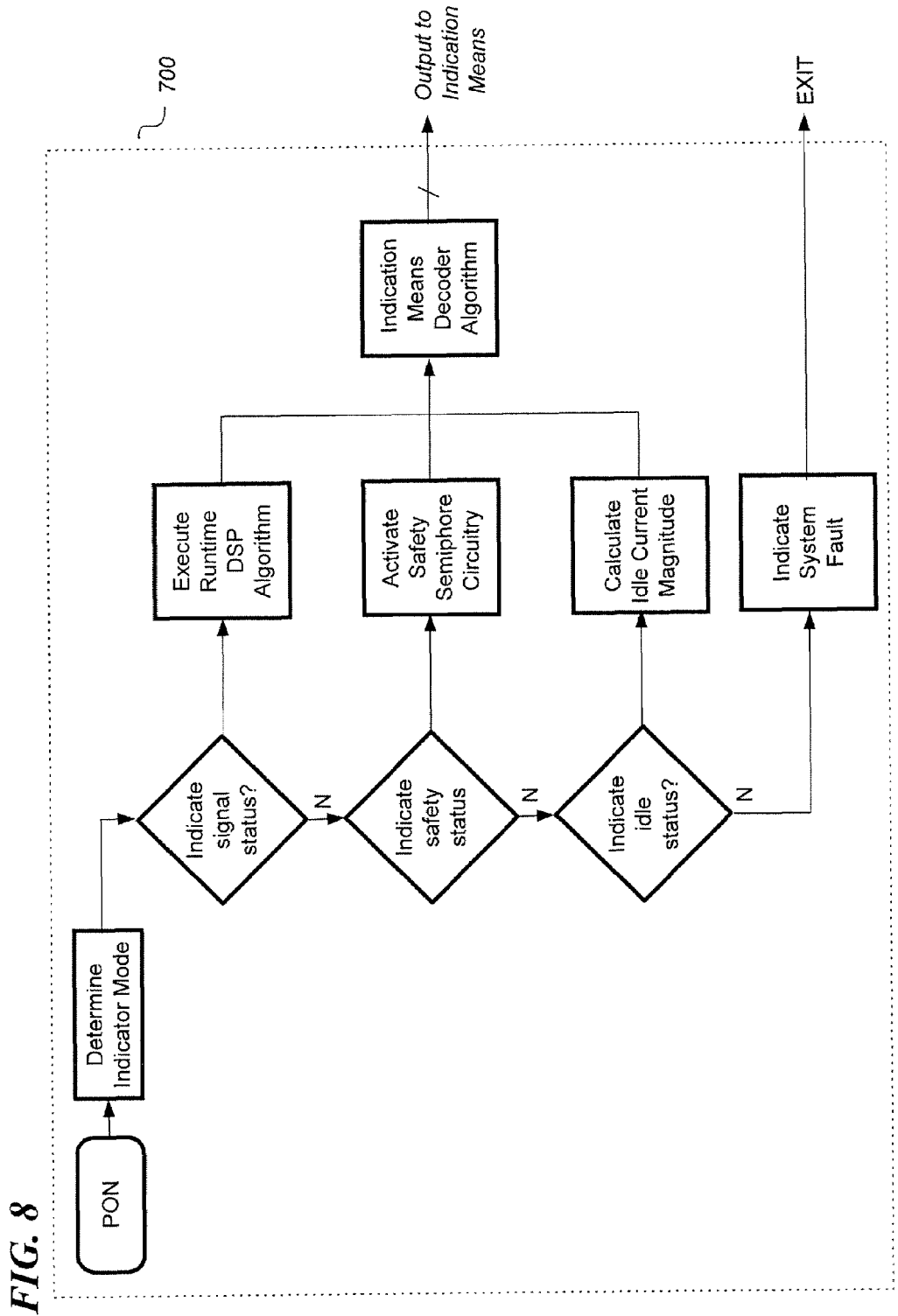
FIG. 8 illustrates an example flow chart for an example indicator system.

FIG. 8 illustrates an example flow chart (800) for an example indicator system. After power is enabled (PON), the system is arranged to determine an indicator mode associated with the tube replacement circuit. For this example, the indicator mode may be a status associated with the system such as: a runtime signal status, a safety status, an idle status, a system fault status, or some other status (e.g., tube type, gain setting, overdrive, clean, etc.). A system fault may be identified when an invalid indicator mode is identified. For each of the above-described indicator modes, an indicator means decoder algorithm receives a communication from the related circuit or circuits to activate or format for an appropriate indication associated with the determined indicator mode (e.g., signal is clipping, overdrive is active, over-voltage safety circuit activated, over-current protection activated, system fault has occurred, etc.). The indicator means decoder algorithm is further arranged in communication with the indication means to decode a detected indicator mode or operating state. The various detected operating states, modes, runtime conditions, biasing conditions, idle current, and other potential operating conditions are provided as information to the indication means for output to the user in audible, visual, or some other indicator form that is presented to the user.

When the identified indicator mode is associated with a runtime signal status, the system may execute a runtime DSP algorithm to analyze various sensory data. The sensory data may be provided to the indication means portion of the system, data-logged, coupled to a computer, or communicated to some other peripheral device(s) as previously described. When the indicator mode is associated with a safety status, the system may activate a safety semaphore circuit (e.g., over-voltage protection circuit, short circuit protection circuit, activate standby mode, etc). When the indicator mode is associated with an idle status, the system may: determine a magnitude associated with an idle current in one or more tube replacement devices, or evaluate a biasing condition associated with one or more tube replacement device.

Although the invention has been described herein by way of example embodiments, variations in the structures and methods described herein may be made without departing from the spirit and scope of the invention. For example, the positioning of the various components may be varied. Individual components and arrangements of components may be substituted as will be appreciated by one skilled in the art having read the instant disclosure. Since many embodiments of the invention can be made without departing from the spirit and scope of the invention, the invention is not limited except as by the appended claims.

What is claimed is:

1. A vacuum tube replacement device, comprising:
   a tube replacement structure;
   an indicator sensing means that is arranged in electrical communication with the tube replacement structure; and
   an indicator means that is arranged in electrical communication with the indicator sensing means such that the indicator means provides an indication of at least one characteristic associated with the tube replacement structure.

2. The vacuum tube replacement device of claim 1, wherein the tube replacement structure is arranged in a standard vacuum tube pin configuration, wherein the standard vacuum tube pin configuration corresponds to at least one of: a pre-amplifier tube, a power-amplifier tube, a rectifier tube, a combined pre-amplifier/power-amplifier tube, a 9 pin pentode, a 9 pin dual triode, a 7 pin pentode, a 7-pin octal, and an 8 pin dual-rectifier arrangement.

3. The vacuum tube replacement device of claim 1, wherein the functions of the indicator sensing means and the indicator means are combined in a single circuit.

4. The vacuum tube replacement device of claim 1, the indicator means comprising an output means that corresponds to at least one of: a visual indicator means, a light-emitting diode (LED) device, multiple LED devices arranged in a circuit, a multi-color LED device arranged in a circuit, multiple LED devices of different colors arranged in a circuit, at least two LED devices that are arranged to illuminate in a sequence pattern, an audio indicator means, a speaker, a buzzer, a piezo device, an audio output buffer, a peripheral interface that is arranged to provide a digital signal output, a peripheral interface that is arranged to provide an analog signal output, a serial communications interface that is arranged to provide serial communications, a parallel communications interface that is arranged to provide parallel communications, a fiber-optic communications interface that is arranged to provide fiber-optic transmission, a modulated communications interface that is arranged to provide modulated transmission, a graphics interface that is arranged to drive a graphics display, an alphanumeric interface that is arranged to drive an alphanumeric display, a CRT interface that is arranged to drive a CRT display, an LCD interface that is arranged to drive an LCD display, and a signal injection means that is arranged to inject an audio signal in an audio signal path of the tube replacement structure.

5. The vacuum tube replacement device of claim 1, wherein the at least one characteristic associated with the tube replacement structure corresponds to at least one of: an operating mode of the tube replacement structure, a biasing condition of the tube replacement structure, an operational status of the tube replacement structure, a failure status of the tube replacement structure, a filament supply status of the tube replacement structure, a high-voltage supply status of the tube replacement structure, a plate voltage status of the tube replacement structure, a cathode voltage status of the tube replacement structure, a plate current status of the tube replacement structure, a cathode current status of the tube replacement structure, an idle current operating class of the tube replacement structure, a signal limiting detection of the tube replacement structure, a power delivery/limiting detection of the tube replacement structure, an operating temperature of the tube replacement structure, an over-power condition of the tube replacement structure, an over-voltage condition of the tube replacement structure, an over-current condition of the tube replacement structure, an over-temperature condition of the tube replacement structure, a saturation condition associated with the tube replacement structure, a wear-out modality for the tube replacement structure, a safety alert for the tube replacement structure, a gain setting of the tube replacement structure, a tube-type of the tube replacement structure, a sound characteristic of the tube replacement structure, an equalization setting of the tube replacement structure, a filter setting of the tube replacement structure, and a real-time performance of the tube replacement structure.

6. The vacuum tube replacement device of claim 1, wherein the tube replacement structure includes at least two power-supply terminals that are coupled to the indicator sensing means, and wherein the indicator sensing means is arranged to monitor a condition associated with power from the at least two power-supply terminals, wherein the at least two power-supply terminals are associated with at least one of: an AC-style filament terminal, a DC-style filament terminal, a plate terminal, a cathode terminal, an anode terminal, a control grid terminal, and a screen grid terminal.

7. The vacuum tube replacement device of claim 1, wherein the indicator sensing means comprises: an LED circuit that is series coupled between two power supply terminals via a resistor circuit.

8. The vacuum tube replacement device of claim 1, wherein the indicator sensing means includes: an LED circuit that is selectively coupled between two power supply terminals via a resistor circuit when selected.

9. The vacuum tube replacement device of claim 1, wherein the indicator sensing means includes: a first LED circuit that is selectively coupled between two power supply terminals via a resistor circuit when the first LED circuit is selected, and a second LED circuit that is selectively coupled between the two power supply terminals via the resistor circuit when the second LED circuit is selected.

10. The vacuum tube replacement device of claim 1, further comprising a selection control circuit that is arranged in cooperation with the indicator means, wherein the indicator means comprises a plurality of selectable LED circuits that are each selectively activated by the selection control circuit.

11. The vacuum tube replacement device of claim 10, wherein the selection control circuit comprises at least one of: a mode select circuit, a memory circuit, a selector circuit, a DIP switch, a digital logic circuit, an analog circuit, a processor based circuit, a push-button style selector, a toggle switch style selector, a read only memory (ROM circuit), a random access memory (RAM), an erasable/programmable memory, an EPROM, an EEPROM, a look-up table, a microcontroller, a microprocessor, a decoder circuit, and an adjuster circuit.

12. The vacuum tube replacement device of claim 1, further comprising a power conditioning circuit that is arranged to provide a local supply from at least two power supply terminals that are associated with the device, wherein the local supply is coupled to at least one of the tube replacement structure, the indicator sensing means, and the indicator means, wherein the power conditioning circuit comprises at least one of: a voltage divider circuit, a resistor divider circuit, a buffer circuit, a filter circuit, a series regulator circuit, a shunt regulator circuit, a switching regulator circuit, a non-switching regulator circuit, an LDO regulator circuit, a current-feedback regulator circuit, a voltage feedback regulator circuit, a DC-DC converter circuit, an AC-DC inverter circuit, a surge protection circuit, an over-voltage protection circuit, a current-limiter circuit, an EMI filter circuit, and a line-filter circuit.

13. The vacuum tube replacement device of claim 1, wherein the tube replacement device includes a top portion of the device is located at an opposite location from a base portion along a longitudinal axis, wherein the top portion and the base portion are separated by a longitudinal portion, and wherein the indicator means is arranged to provide an illumination from at least one of the top portion, the longitudinal portion, and the base portion.

14. An apparatus for providing indications for a vacuum tube replacement circuit, the apparatus comprising:
a power conditioning circuit that is arranged to provide a local supply;
a reference generator circuit that is coupled to the local supply, wherein the reference generator is arranged to provide a reference voltage;
a sense circuit that is arranged to generate a sense voltage;
a diode circuit that is series coupled between a power terminal and a ground terminal through the sense circuit;
an indicator circuit; and
a comparator circuit that is arranged to activate the indicator circuit in response to a comparison of the sense voltage to the reference voltage.

15. The apparatus of claim 14, wherein the power terminal is coupled to at least one of: a plate terminal of the tube replacement circuit, and a cathode terminal of the tube replacement circuit via a resistor circuit.

16. The apparatus of claim 14, wherein the indicator circuit comprises at least one of:
a visual indication circuit, an audible indication circuit, and an interface circuit for communicating with external devices.

17. The apparatus of claim 14, wherein the power conditioning circuit comprises at least one of: a regulator circuit, a transformer circuit, a rectifier circuit, a filter circuit, an over-voltage protection circuit, a current-limiter circuit, a voltage limiter/clamp circuit, a buffer circuit, an isolation circuit, a voltage scaling circuit, a switching-type regulator, a non-switching type regulator, a DC-DC converter, an AC-DC inverter, a series regulator, a shunt regulator, an LDO regulator, a current-feedback regulator, a voltage feedback regulator, a passive filter circuit, an active filter circuit, a high pass filter, a low pass filter, a band pass filter, a notch filter, an inverse notch filter, a filter capacitor, and a storage capacitor.

18. The apparatus of claim 14, wherein the reference generator circuit comprises at least one of: a resistor circuit, a resistor divider network, a diode circuit, a stacked diode circuit, a capacitor circuit, a band-gap reference circuit, a digital-to-analog converter, a regulator circuit, a filter circuit, a buffer circuit, an isolation circuit, a voltage scaling circuit, a switching-type regulator, a non-switching type regulator, a DC-DC converter an AC-DC inverter, a series regulator, a shunt regulator, an LDO regulator, a current-feedback regulator, a voltage feedback regulator, a passive filter circuit, an active filter circuit, a high pass filter, a low pass filter, a band pass filter, a notch filter, an inverse notch filter, a filter capacitor, and a storage capacitor.

19. The apparatus of claim 14, wherein the sense circuit comprises at least one of: a resistor circuit, a resistor divider network, a diode circuit, a stacked diode circuit, a capacitor circuit, a voltage divider circuit, a filter circuit, a potentiometer, a selectable resistor divider circuit, and an integration time sensitive circuit.

20. The apparatus of claim 14, wherein the sense circuit, the reference generator circuit, and the comparator circuit are arranged to cooperate with one another to selectively activate the indicator circuit such that the indicator circuit indicates at least one of: a plate voltage that is detected within a predetermined operating range, a voltage clipping associated with the plate voltage, a signal magnitude that is within a predetermined range of magnitudes, a signal frequency that is within a predetermined range of frequencies, a saturation associated with an amplification stage, a clipping associated with an amplification stage, a magnitude of current flowing through the tube replacement circuit, a quiescent bias current indicating class A operation, a quiescent bias current indicating class B operation, a quiescent bias current indicating class AB operation, an idle signal detection, a peak operating current condition, and a power supply sag condition.

21. An apparatus for providing indications for a vacuum tube replacement circuit, the apparatus comprising:
a reference generator means that is arranged to provide at least one reference signal;
a sensor means that is arranged to provide at least one sense signal;
an indicator means that is arranged to provide at least one indication in response to at least one control signal;
a sensor processing means that is arranged to: evaluate the at least one reference signal, evaluate the at least one sense signal, and adjust the at least one control signal in response to the evaluated signals; and
a decoder circuit that is arranged to: monitor a power supply terminal associated with the tube replacement circuit, capture an encoded data signal from the monitored power supply terminal, decode a control command from the captured encoded data signal, and provide a control signal in response to the control command, wherein the control signal is coupled to at least one of: the reference generator means, the sensor means, the indicator means, and the sensor processing means such that an operational characteristic of the indicator means is adjusted in response to the control command.

22. The apparatus of claim 21, wherein the sensor means is arranged such that the at least one sense signal corresponds to at least one of: an operating current associated with the tube replacement circuit, an idle current associated with the tube replacement circuit, a plate voltage associated with the tube replacement circuit, a cathode voltage associated with the tube replacement circuit, a grid voltage associated with the tube replacement circuit, a screen voltage associated with the tube replacement circuit, a filament supply voltage associated with the tube replacement circuit, and an operating temperature associated with the tube replacement circuit.

23. The apparatus of claim 21, wherein the sensor means comprises a first sensor means and a second sensor means, wherein the first sensor means is arranged to sense a current associated with a cathode terminal of the tube replacement circuit, and wherein the second sensor means is arranged to sense a plate voltage associated with the plate terminal of the tube replacement circuit.

24. The apparatus of claim 21, wherein the sensor means is arranged to sense a current associated with a cathode terminal of the tube replacement circuit, and wherein the reference generator means is arranged to sense a plate voltage associated with the plate terminal of the tube replacement circuit.

25. The apparatus of claim 21, wherein the monitored power supply terminal is associated with at least one of: a DC filament terminal, an AC filament terminal, a plate terminal, a cathode terminal, an anode terminal, a screen terminal, and a grid terminal.

26. The apparatus of claim 21, further comprising a latch means that is arranged to store the control command.

27. The apparatus of claim 21, further comprising an encoder circuit that is arranged to: receive data, encode the data for transmission, and transmit the data over another power supply terminal that is associated with the tube replacement structure.

28. The apparatus of claim 21, further comprising an encoder circuit that is arranged to: receive data, encode the data for transmission, and transmit the data over the power supply terminal that is associated with the tube replacement structure.

29. The apparatus of claim 21, wherein the encoded data signal is provided according to a coded format, wherein the coded format corresponds to at least one of: a modulated data signal, an amplitude modulated (AM) data signal, a frequency modulated (FM) data signal, a frequency shift keyed (FSK) data signal, a pulse-code modulated (PM) data signal, a phase-shift keyed (PSK) data signal, and a spread spectrum signal.

30. An apparatus for providing indications for a vacuum tube replacement circuit, the apparatus comprising:
a reference generator means that is arranged to provide at least one reference signal;
a sensor means that is arranged to provide at least one sense signal;
an indicator means that is arranged to provide at least one indication in response to at least one control signal; and
a sensor processing means that is arranged to: evaluate the at least one reference signal, evaluate the at least one sense signal, and adjust the at least one control signal in response to the evaluated signals, wherein the sensor processing means comprises: an analog-to-digital converter (ADC) circuit and a digital processing circuit, wherein the ADC circuit is responsive to at least one of the at least one reference signal and the at least one sense signal, and wherein at least one output from the ADC circuit is in communication with the digital processing circuit.

31. The apparatus of claim 30, the sensor processing means further comprising a switching means that is arranged to selectively couple a selected one of the at least one reference signal and the at least one sense signal to the ADC circuit for evaluation.

32. The apparatus of claim 31, wherein the selected one is determined according to at least one of: a wired connection, a selection initiated by a user, a predetermined selection, an operational program, a time control circuit, and a counter circuit.

33. The apparatus of claim 30, wherein the ADC circuit comprises a plurality of analog-to-digital converters that are each configured to evaluate a different input signal from the at least one reference signal and the at least one sense signal.

34. The apparatus of claim 30, wherein the digital processing circuit is arranged to evaluate received data and determine at least one of: an operational status of the tube replacement circuit, an operational mode of the tube replacement circuit, a fault condition of the tube replacement circuit, an operating time associated with the tube replacement circuit, an operating voltage associated with the tube replacement circuit, an operating current associated with the tube replacement circuit, a power dissipation associated with the tube replacement circuit, a signal distortion associated with the tube replacement circuit, an operating temperature associated with the tube replacement circuit, a signal interference associated with the tube replacement circuit, an operating frequency associated with the tube replacement circuit, a statistical noise analysis, a statistical frequency analysis, a statistical distortion analysis, a statistical signal energy analysis, and a user derived signal processing function.

35. A method for providing indicators for a vacuum tube replacement circuit, comprising:
sensing a signal associated with the vacuum tube replacement circuit to provide a sense signal;
evaluating the sense signal to identify a change in an indication status; and
adjusting an indication for an indicator when the change in the indication status is detected.

36. The method of claim 35, wherein the step of evaluating the sense signal comprises: executing a DSP algorithm to evaluate data associated with the sense signal, and decoding the results from the DSP algorithm.

37. The method of claim 35, wherein the step of evaluating the sense signal comprises: calculating a magnitude associated with a current associated with the vacuum tube replacement circuit, and identifying the change in the indication status when the magnitude of the current associated with the vacuum tube replacement circuit is in a predetermined operating range.

38. The method of claim 35, wherein the step of evaluating the sense signal comprises: calculating a magnitude associated with a current associated with the vacuum tube replacement circuit, and identifying the change in the indication status when the magnitude of the current associated with the vacuum tube replacement circuit exceeds a predetermined threshold.

39. The method of claim 35, wherein the step of evaluating the sense signal comprises: calculating a magnitude associated with a voltage associated with the vacuum tube replacement circuit, and identifying the change in the indication status when the magnitude of the voltage associated with the vacuum tube replacement circuit is in a predetermined operating range.

40. The method of claim 35, wherein the step of evaluating the sense signal comprises: calculating a magnitude associated with a voltage associated with the vacuum tube replacement circuit, and identifying the change in the indication status when the magnitude of the voltage associated with the vacuum tube replacement circuit exceeds a predetermined threshold.

41. The method of claim 35, further comprising:
receiving a coded data transmission from at least one terminal associated with the vacuum tube replacement circuit;
decoding the coded data transmission to provide a control command; and
communicating the control command to a program control circuit to change an operating mode of the indicator.

42. The method of claim 35, further comprising:
logging data for transmission;
coding a coded data transmission for the logged data; and
communicating the coded data transmission over at least one terminal associated with the vacuum tube replacement circuit.

43. The method of claim 42, wherein the coded data transmission includes an indication for at least one of: an operational status of the tube replacement circuit, an operational mode for the tube replacement circuit, an operational mode for the indicator, a status associated with the indicator, and indicator data.

* * * * *